United States Patent [19]

Caspell et al.

[11] Patent Number: 4,726,045
[45] Date of Patent: Feb. 16, 1988

[54] LOW JITTER DIGITAL DELAY GENERATOR

[75] Inventors: George J. Caspell, Hillsboro; Agoston Agoston, Beaverton, both of Oreg.

[73] Assignee: Tektronix, Inc., Beaverton, Oreg.

[21] Appl. No.: 845,282

[22] Filed: Mar. 28, 1986

[51] Int. Cl.[4] ...................... H03K 23/66; H03K 19/23
[52] U.S. Cl. ...................................... 377/110; 377/20; 328/129.1; 328/58; 307/265
[58] Field of Search ........................ 307/463, 518, 265; 328/129.1, 130.1, 58; 377/20, 39, 107, 110, 114, 44

[56] References Cited

U.S. PATENT DOCUMENTS

| | | | |
|---|---|---|---|
| 3,391,305 | 4/1965 | Bradwin et al. | 377/110 |
| 3,774,056 | 11/1973 | Sample et al. | 377/110 |
| 4,467,319 | 8/1984 | Uchikoshi | 377/107 |
| 4,622,481 | 11/1986 | Nortup | 377/39 |

FOREIGN PATENT DOCUMENTS 657618  4/1979  U.S.S.R. ............................. 377/114

Primary Examiner—Stanley D. Miller
Assistant Examiner—Tai V. Duong
Attorney, Agent, or Firm—John P. Dellett; George T. Noe

[57] ABSTRACT

A programmable delay generator is based upon an asynchronous or ripple counter the stages of which change state at definably different times. A full terminal count is decoded including the condition of a lowest order stage which changes state at a unique time which is different from the time at which any other stage changes, for thereby defining an unambiguous delay period. A partial terminal count programmably determines the length of circuit output and the reloading of the ripple counter with a programmable, time delay determining, initial value.

5 Claims, 3 Drawing Figures

LOW JITTER DIGITAL DELAY GENERATOR

BACKGROUND OF THE INVENTION

The present invention relates to a programmable digital delay generator and particularly to such a generator for indicating an accurate delay period without the presence of time variations or jitter in the output signal.

A programmable delay generator is one that finds use, for example, in a digital oscilloscope wherein a multiplicity of samples of an input signal are taken at digitally adjustable times. These samples of the input signal are digitally stored and may be read out at a slower rate for display on a cathode-ray tube.

Successive samples of an input signal can be taken at times which may change with respect to an input triggering signal and these times are suitably determined by means of a digital counter. For example, the counter may be preloaded with different numbers after which the counter steps to a predetermined terminal count that is detected for generating a desired signal sampling pulse.

Heretofore, synchronous counters have been employed for sample timing purposes because of their accuracy of operation and the speed with which they change from one count to the next. A synchronous counter is characterized by a common clock pulse which causes all counter stages to change state (if they are otherwise enabled) at the same time. Then, when the counter reaches a predetermined terminal count, this terminal count is rapidly detected for setting the time that signal sampling is to take place.

Although all the stages of a synchronous counter are clocked by the safe clock signal and are supposed to change states at the same time, this in fact is not realized. Moreover, clock distribution may be a problem in a fast counter.

In a given synchronous counter of given circuit configuration some undetermined stage may change states before some other stage, and as a matter of fact all the stages may change state at times which are unpredictably different. Therefore, since the counter stages do not in fact operate in synchronism when measured on an accurate time scale, the sampling pulses generated thereby may not occur at accurately predetermined times, or at times properly interrelated to other sampling pulses. Consequently, even though the construction of a synchronous counter is comparatively complex and expensive, the timing information derived therefrom may be inaccurate and undependable. The result is improper sampling operation and jitter at high speeds.

SUMMARY OF THE INVENTION

In accordance with the present invention in a particular embodiment thereof, a low jitter digital delay generator comprises a preloaded ripple counter or asynchronous counter and means for determining when such asynchronous counter reaches a predetermined count. In the case of the ripple counter or asynchronous counter, the counter stages trigger one another in succession with only the first stage receiving the system clock pulse. Then, in decoding a full terminal count, a given stage, e.g. the first clocked stage, will be the last stage to achieve a predetermined condition at an accurately predetermined time. The count conditions of other stages whose outputs combine with the output of the first stage to determine the full terminal count will always have attained a stable state by the time the first stage changes state the last time, and therefore no ambiguity exists in determining the desired lapse of time.

In accordance with another aspect of the present invention, a sampling or output pulse is initiated at the time of full terminal count, and this output is concluded when a partial terminal count is decoded from the "faster" stages of the ripple counter, i.e., selected lower order stages including the first stage. The conclusion of the sampling or output pulse is therefore accurately predetermined, and a sampling or output pulse of desired length is accurately generated.

The full terminal count of the counter is preferably ascertained at the time when the first stage becomes active before activation of the following stage, for supplying a decoded indication of when all the selected outputs attain a predetermined condition.

It is accordingly an object of the present invention to provide an improved digital delay generator which is characterized by enhanced accuracy and low jitter.

It is another object of the present invention to provide an improved digital delay generator for supplying an output pulse of accurately predetermined and programmable duration.

It is a further object of the present invention to provide an improved digital delay generator which is characterized by accuracy of operation while being inexpensive in implementation.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of a digital delay generator according to the present invention, FIG. 2 is a first waveform chart illustrating operation of the FIG. 1 circuit, and FIG. 3 is second waveform chart illustrating operation of the FIG. 1 circuit.

DETAILED DESCRIPTION

Figure 1:
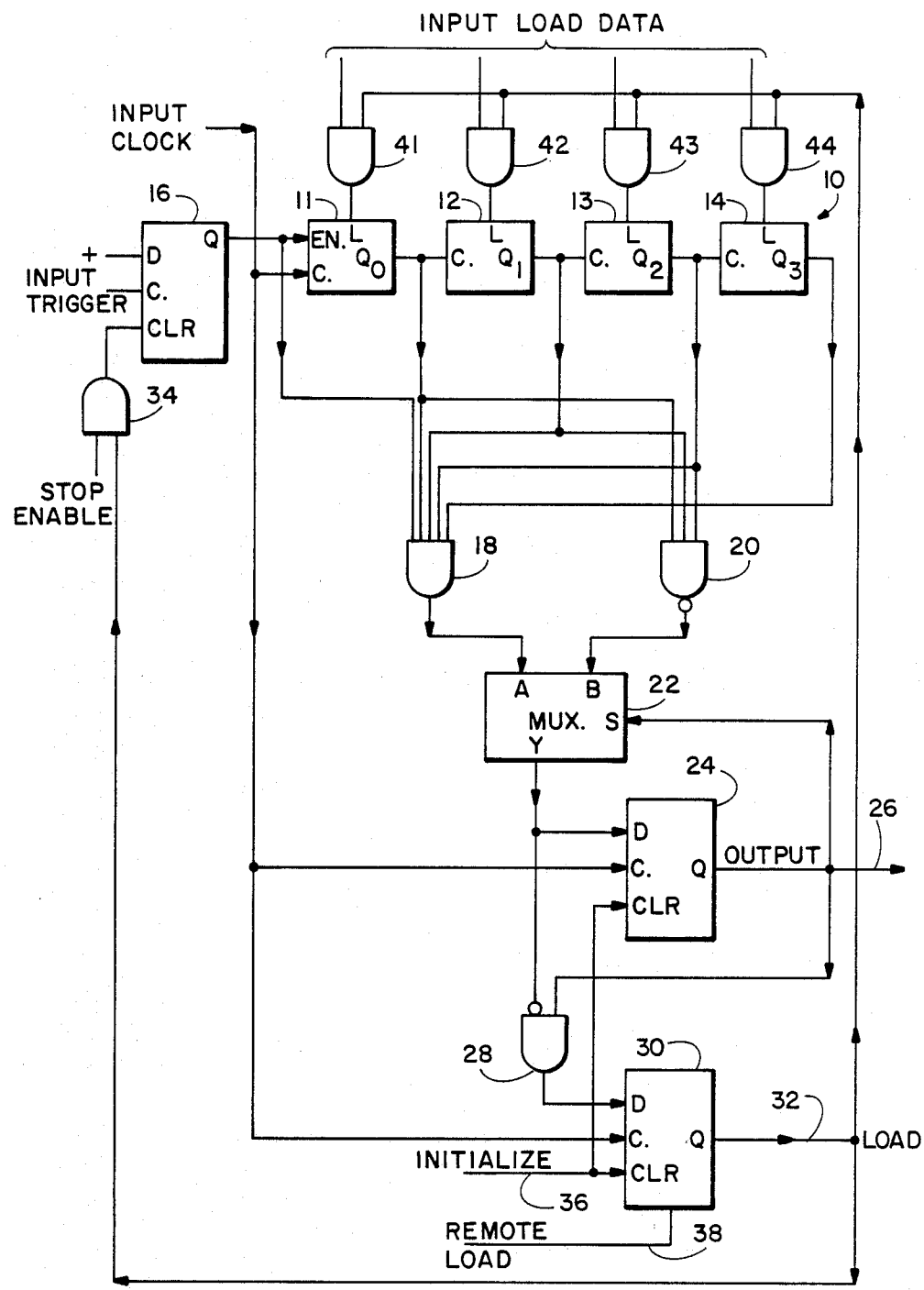

Referring to the drawings and particularly to FIG. 1, illustrating the digital delay generator according to the present invention in schematic diagram form, such digital delay generator comprises an asynchronous or ripple counter 10 comprising successive flip-flop stages 11, 12, 13 and 14. The first flip-flop stage 11 is clocked by the system clock or input clock, while the $Q_0$ output of stage 11 is supplied as the clocking input for the next stage 12. Similarly, each stage successively clocks or triggers the following stage such that operation of the counter is characterized by a ripple effect with each stage operating the next in response to the alternate change of its own state.

Figure 2:
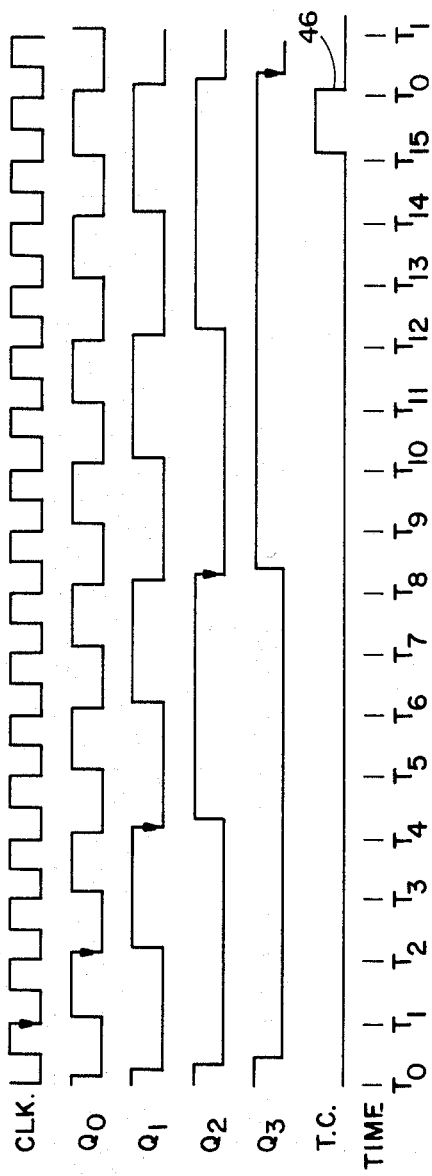

The operation of this counter is more fully illustrated by the waveform chart or timing diagram of FIG. 2 wherein the input clock is designated "CLK." and the Q output of stages 11, 12, 13 and 14 are successively illustrated at $Q_0$, $Q_1$, $Q_2$ and $Q_3$. As will be seen, each negative going edge or transition of the clock input causes the $Q_0$ output of stage 11 to change. Similarly each negative going transition in the output of stage 11 produces a change in state at stage 12 as indicated at $Q_1$.

Thus, every other transition for stage 11 produces a transition in stage 12, and similarly stages 13 and 14 produce "divided down" outputs in a manner well understood by those skilled in the art. Stage 14 may be considered the highest order stage inasmuch as it conventionally produces the highest order digit in a count represented by the Q outputs of the counter, and stage 11 is designated the lowest order stage inasmuch as its output would represent the lowest order digit in a count output. Stage 11 is also seen to be the "fastest" stage since its state changes the most frequently.

It will be noted from the waveform chart or timing diagram of FIG. 2 that the change in state of the output of stage 12 (i.e., at $Q_1$) occurs after a negative going change in state for stage 11 (represented at $Q_0$) by virtue of the delay in operation of stage 12. Similarly, the outputs of stages 13 and 14, represented at $Q_2$ and $Q_3$, change a discernible time after being triggered. This characteristic is advantageously employed in the generator according to the present invention which preferably bases detection upon the change in state of one stage, i.e., the lowest order or fastest stage 11.

Returning to the circuit of FIG. 1, stage 11 is enabled for receiving the input clock by "D" flip-flop or latch 16 having its "D" input connected to a high or positive potential while receiving the input trigger for the circuit at its clock input "C". In an oscilloscope sampling operation, the input trigger will generally be related to some time event or the specific occurrence of a signal that is to be represented and viewed. The Q output of flip-flop 16, in addition to being coupled to the enable input of flip-flop 11, is also connected as one input of AND gate 18 forming a full terminal count decoder in accordance with the present invention. The AND gate 18 receives other inputs comprising the Q outputs of each of the stages 11, 12, 13 and 14 of counter 10.

A NAND gate 20, forming a partial terminal count decoder in accordance with the present invention, receives as its inputs the Q outputs of each of counter stages 11, 12 and 13. The number of outputs from counter stages applied to gate 20 (as well as to gate 18) is a matter of selection and predetermined according to the characteristics of the final output or sampling pulse that would be supplied by the circuit. Generally, the inputs to NAND gate 20 will be supplied from the lower order or "faster" stages of the counter, in this case lower order stages 11, 12 and 13.

The outputs of AND gate 18 and NAND gate 20 are coupled respectively to the A and B inputs of multiplexer 22 which selects one of these and presents the same at output Y in accordance with selection input S. When selection input S is "down", input A will be provided on output Y of the multiplexer.

Multiplexer output Y is coupled to the "D" input of a flip-flop or latch 24 which produces the final output or sampling pulse for the present circuit on its Q output lead 26. The Q output of flip-flop 24 is also supplied as the selection or S input of multiplexer 22 and as an input to AND gate 28 further receiving the Y output of the multiplexer as an inhibiting input. Flip-flop 24 is clocked by the system or input clock signal.

AND gate 28 drives the "D" input of load flip-flop or latch 30, which also receives the system clock, and produces a load signal on its Q output variously supplied to counter 10 for loading purposes and to stop enable gate 34. An initialize signal lead 36 is connected to the clear inputs of output flip-flop 24 and load flip-flop 30, while a remote load lead 38 connects to the preset input of flip-flop 30.

The load output from terminal Q of the load flip-flop on lead 32 is supplied to each of AND gates 41, 42, 43 and 44, the outputs of which are respectively connected to the load or set inputs of flip-flops 11, 12, 13 and 14. Input load data is provided to the AND gates 41-44 in a known manner such that the lowest order preload digit is coupled via gate 41 and the highest order preload digit is coupled via gate 44 when the gates 41-44 are enabled by means of the load output. It will be understood the stages of counter 10 are illustrated in schematic or block fashion and a reset signal (not shown) may be applied to each of the stages before loading, in a manner understood by those skilled in the art, to zero the counter.

Considering now the overall operation of the circuit of FIG. 1, an initialize pulse is first applied to lead 36 for clearing the flip-flops 24 and 30 such that each of their output signals is false. It will be assumed that the counter 10 is loaded and that the output of flip-flop 16 is initially false such that the counter 10 as well as the terminal count decoder formed by AND gate 18 are disabled. At this time, the multiplexer 22 is set to monitor the output of AND gate or full terminal count decoder 18. Operation then begins with an active transition of the input signal or input trigger applied to the C input of flip-flop 16. The flip-flop 16 is clocked active for enabling the first stage 11 of the counter, as well as AND gate 18. The counter will then proceed to count the input clock pulses delivered at the C input of counter stage 11 in the manner illustrated in FIG. 2, i.e., with each stage triggering the next to provide successively divided down outputs at each stage until a terminal count, defined by the inputs of AND gate 18, is reached. In the present example, when the Q outputs of each of the flip-flops 11-14 are positive, the output of AND gate 18 is enabled which, via multiplexer 22, is supplied as the "D" input of flip-flop 24.

The output of AND gate 18 is designated "T.C." for "terminal count" and is illustrated in FIG. 2 as a pulse 46. For the connections illustrated in FIG. 1, terminal count takes place immediately after time $t_{15}$, i.e., when $Q_0$ goes positive while $Q_1$, $Q_2$ and $Q_3$ are also positive. If all the stages of the counter were initially set to zero, at time $t_0$, then terminal count or T.C. occurs 15 clock periods after $t_0$ (plus circuit delay in flip-flop 11 and gate 18) assuming the input trigger occurred at $t_0$. The pulse T.C. continues until slightly after $t_{16}$ (that is, $t_0$), plus the delay through flip-flop 11 and gate 18, inasmuch as a $Q_0$ output of flip-flop 11 goes low.

It will be noted there is no ambiguity in the production of T.C. pulse 46 inasuch as the time when $Q_0$ rises immediately after time $t_{15}$ is unique. It will be noted, on the other hand, that if all stages switched at the same time as in a synchronous counter, a false output could be produced at time $t_{14}$ when $Q_1$, $Q_2$ and $Q_3$ were up and $Q_0$ is dropping. For that matter, a false indication might be given at time $t_{12}$ or at other points when all the flip-flops may be partially enabled. However, in the case of an asynchronous or ripple counter wherein the change of state of each stage occurs at a uniquely different time there can be no ambiguity in detection of the elapsed period, in this example immediately following time $t_{15}$.

Although the production of the T.C. pulse 46 is preferred on the rising edge of $Q_0$, that is by detection of the active output of stage 11 before activation of the following stage 12 by means of the Q output of stage 11, because of the greater length of time afforded for detection and length of pulse output, it is also possible to generate terminal count, T.C., in response to other predetermined conditions of the stages.

Figure 3:
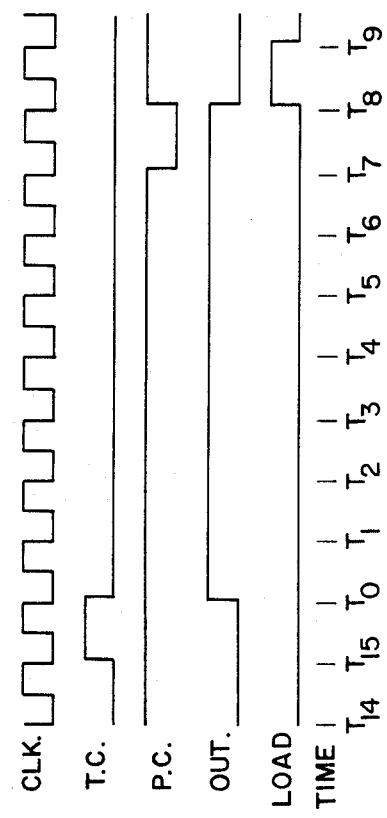

Further considering the operation of the circuit of FIG. 1, after the pulse T.C. coupled through multiplexer 22 is applied to the "D" input of the output flip-flop 24 the output of flip-flop 24 becomes active on the next clock edge, as illustrated by the waveform "OUT" in FIG. 3. This output, on lead 26, is the output of the delay generator according to the present invention and is suitably utilized as a sampling pulse or the like. Since the terminal count pulse T.C. is accurately produced in an unambiguous manner, the "OUT" pulse is likewise accurately predetermined in time.

The pulse "OUT" further causes the multiplexer 22 to select output B of the partial terminal count decoder NAND gate 20. Since NAND gate 20 produces an inverted output, and since it will be noted $Q_0$ is false by this time, the output of NAND gate 20 will be high. The flip-flop 24 thus maintains its active output for a predetermined time programmed according to the connections of the inputs of NAND gate 20. In the present example, the outputs $Q_0$, $Q_1$ and $Q_2$ are supplied as inputs to the partial terminal count decoder NAND gate 20, these outputs being produced by the three "fastest" stages of the counter. Consequently a high output is provided at multiplexer terminal Y until immediately after $t_7$ in FIG. 2 at which time the three inputs of NAND gate 20 are all high (the last to become high being uniquely the output $Q_0$), and the output of NAND gate 20, as well as the output Y of multiplexer 22, go low. The Q output of flip-flop 24 drops upon the next negative transition of the input clock or system clock pulse, thereby accurately concluding the pulse "OUT" on lead 26. It will be observed that the duration of pulse "OUT" is programmed according to the "faster" inputs supplied to NAND gate 20. Therefore, the partial terminal count decoder will provide its indication at a different and lower count after the decoded indication of the full terminal count decoder.

At the same time the output of flip-flop 24 goes false, flip-flop 30 becomes active for one clock cycle, producing the "LOAD" signal on lead 32, i.e., at the Q output of flip-flop 30. As will be seen when the output Y of multiplexer 22 goes low, gate 28 is no longer disabled, and moreover the Q output of flip-flop 24 will still be high at that time inasmuch as flip-flop 24 has yet to be clocked. Therefore, the output of gate 28 supplies the required "D" input for gate 30 whereby gate 30 is clocked high by the next negative going transition of the clock pulse that clocks flip-flop 24 low. Of course, when the following clock pulse occurs, the Q output of flip-flop 24 will be low and therefore flip-flop 30 goes low after one clock cycle.

The load pulse, indicated at the lower portion of FIG. 3, energizes AND gates 41–44 for loading the input load data into counter 10 for the next cycle of operation. It is understood this input load data may remain the same if a constant delay is desired. The load pulse is also provided to the clear input of flip-flop 16 via stop enable AND gate 34, but will only reach the flip-flop 16 if the stop enable input of gate 34 is on. If the stop enable input is thus energized, the circuit will halt after providing one output pulse, but will otherwise continue for another cycle of operation with the delay being dependent upon the input load data as mentioned above.

An active signal on remote load connection 38 will cause a preset condition of flip-flop 30 whereby a load pulse is generated thereby causing a load of counter 10 at an externally determined time. The remote load input is suitably preceded by an initialize input on lead 36. New "input" load data may be provided via a computer bus or the like for changing the delay period.

Thus, the circuit according to the present invention comprises a programmable digital delay generator wherein the amount of delay as well as the length of the output pulse may be programmed. Low jitter is introduced in the delay path and significantly less circuitry is required than with the typical approach of using synchronous counters. The delay range can be easily expanded using slower and lower power logic families. No "glitches" are produced in decoding the terminal count due to the operation of the ripple counter.

Although a four stage counter 10 is depicted herein by way of illustration, it will be appreciated that a larger number of stages may be, and usually are, employed in such counter. It will also be appreciated that the inputs to gates 18 and 20 may be derived from the concluding stages of a longer counter, and for purposes of the claims, the first stage of the counter is considered to be the first or lowest order stage whose output is decoded. The inputs to gate 20 are from a number of successive "faster" stages, dependent upon the length of the output pulse desired, while the inputs to gate 18 preferably include the gate 20 inputs plus the outputs from a next higher order stage or successive stages to provide a "full count".

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:
1. Circuitry for accurately timing a predetermined period, comprising:
   an asynchronous counter comprising a plurality of bistable stages including a first stage that is triggered first, and a last stage that is triggered last, wherein each stage is triggered after the preceding stage, each stage providing an output having a divided relation to its input,
   decoder means for receiving inputs responsive to conditions of selected bistable stages including said first stage and for decoding the same, including detecting a change in condition of said first stage to a predetermined state for supplying a decoded indication when the remainder of the selected stages have already attained predetermined states, whereby a stable decoded indication is provided in response to said first stage attaining a predetermined state at a time different from the times the remainder of said selected stages attain predetermined states,
   means responsive to said stable decoded indication for initiating a timing output pulse,
   second decoder means responsive to conditions of less than all said selected bistable stages including only stages changing state more frequently than the last stage of said selected bistable stages for supplying a second decoded indication after the first mentioned decoded indication, including means for concluding said timing output pulse in response to said second decoded indication, and means for automatically loading said counter substantially at the conclusion of said timing output pulse with a selected number for determining the lapse of time between initial triggering of said first stage and the presence of the first mentioned decoded indication.

2. The circuitry according to claim 1 wherein each said bistable stage includes a triggering input terminal and an output terminal at which the state of the stage is indicated, wherein the output terminal of each stage except the last is connected in driving relation to the triggering input of the next stage, said decoder means being connected to stage output terminals.

3. The circuitry according to claim 2 wherein said decoder means comprises an AND gate.

4. Circuitry for accurately timing a predetermined period, comprising:

an asynchronous counter comprising a plurality of bistable stages wherein the first such stage receives a trigger input and the output of such stage triggers the next, each stage providing an output having a divided relation to its input, decoder means for receiving inputs from selected outputs of said bistable stages and detecting said outputs, including detection of the active output of the first stage before activating of the following stage by the output of the first stage, for supplying a decoded indication when all the selected outputs attain a predetermined full count condition, said first stage being the last to attain said active output after the rest of the stages are stable so as to produce a stable decoded indication, means responsive to said stable decoded indication for initiating a timing output pulse, second decoder means responsive to conditions of less than all the selected outputs attaining a predetermined count condition for supplying a second decoded indication after the first mentioned decoded indication, including means for concluding said timing output pulse in response to said second decoded indication, and means for automatically loading said counter substantially at the conclusion of said timing output pulse with a selected number for determining the lapse of time between the first triggering of sid first stage and the presence of the first mentioned decoded indication.

5. The circuitry according to claim 1 further including triggering means responsive to an input trigger and coupled for enabling the first stage of said counter to count a periodic input clock signal, and wherein said means responsive to said stable decoded indication for initiating a timing output pulse is triggered by said periodic input clock signal.

* * * * *